(12) United States Patent
Lin

(10) Patent No.: US 6,296,991 B1
(45) Date of Patent: Oct. 2, 2001

(54) BI-FOCUS EXPOSURE PROCESS

(75) Inventor: Benjamin Szu-Min Lin, Hsin-Chu (TW)

(73) Assignee: United Microelectronics Corp. (TW)

(*) Notice: Subject to any disclaimer, the term of this patent is extended or adjusted under 35 U.S.C. 154(b) by 0 days.

(21) Appl. No.: 09/471,078

(22) Filed: Dec. 22, 1999

(51) Int. Cl.⁷ .................................................. G03F 9/00
(52) U.S. Cl. ............................................. 430/322; 430/394
(58) Field of Search .......................... 430/5, 322, 394; 250/492.22

(56) References Cited

U.S. PATENT DOCUMENTS 5,637,424 * 6/1997 Haruki et al. ............................ 430/5

* cited by examiner

Primary Examiner—S. Rosasco

(57) ABSTRACT

A bi-focus exposure process for exposing a wafer through a mask is described. The mask comprises a plurality of first transparent hole features having a phase shift of about 0 degrees and a plurality of second transparent hole features having a phase shift of about 180 degrees, the first and the second hole features are alternatively located on a transparent substrate, and each of the hole features is substantially and adjacently surrounded by a lightly transparent material having a phase shift of about 90 degrees on the transparent substrate. The patterns of the first hole features are printed on the wafer by exposing the wafer through the mask at a first defocus smaller than 0 μm defocus. The patterns of the second hole features are printed on the wafer by exposing the wafer through the mask at a second defocus smaller than 0 μm defocus.

12 Claims, 6 Drawing Sheets

DEFOCUS+0.3μm

BI-FOCUS

BI-FOCUS EXPOSURE PROCESS

BACKGROUND OF THE INVENTION

1. Technical Field

The present invention relates to lithography, and particularly to an exposure process.

2. Description of Related Art

Integrated circuit fabrication requires high precision techniques to achieve. Any minute errors in the fabrication process cause the fabricated wafer to be unreliable or even unusable, which worsens wafer yield.

Photolithography technology is the most important process in semiconductor fabrication. This technology prints mask patterns onto wafers for fabrication of various circuit components including MOS (metal-oxide semiconductor) components, doped areas, and other else in the integrated circuit. IC fabrication typically requires several photolithography processes to complete. Each of the photolithography processes comprises three basic steps: coating, exposure, and development.

Current photolithography technique uses fixed illumination condition, exposure energy and defocus, to print mask patterns onto wafers. However, as IC dimension shrinks, photolithography is pushed to its resolution limit due to narrow pitch of patterns. Double-exposure operation using two masks is proposed to solve the narrow pitch issue. However, this operation suffers low throughput caused by mask exchanging. Moreover, it is difficult to align the second mask precisely to the previously exposed areas on the wafers using the first mask. Furthermore, the two masks inherently possess mask errors between them, thereby worsening this double-exposure operation.

SUMMARY OF THE INVENTION

It is an object of this invention to provide an exposure process that can be performed on a wafer.

Other objects and advantages of this invention will become apparent to those of ordinary skill in the art having reference to the following specification in conjunction the drawings.

A bi-focus exposure process for exposing a wafer through a mask is described. The mask comprises a plurality of first transparent hole features having a phase shift of about 0 degrees and a plurality of second transparent hole features having a phase shift of about 180 degrees, the first and the second hole features are alternatively located on a transparent substrate, and each of the hole features is substantially and adjacently surrounded by a lightly transparent material having a phase shift of about 90 degrees on the transparent substrate. The patterns of the first hole features are printed on the wafer by exposing the wafer through the mask at a first defocus. The patterns of the second hole features are printed on the wafer by exposing the wafer through the mask at a second defocus.

The above first defocus and the second defocus are preferably about −0.3 μm and +0.3 μm defocuses, respectively. The above lightly transparent material has a preferable transmission of about 6%.

By exposing through only one previously described mask, a double exposure can be performed on the wafer without mask exchanging, thereby increasing the throughput. Moreover, this double exposure has no mask errors and alignment issues, because the double exposure is performed using only one mask. Furthermore, this invention increases the width of the pitch without affecting the final patterns printed on the wafer, thereby improving the exposure resolution.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Figure 1:
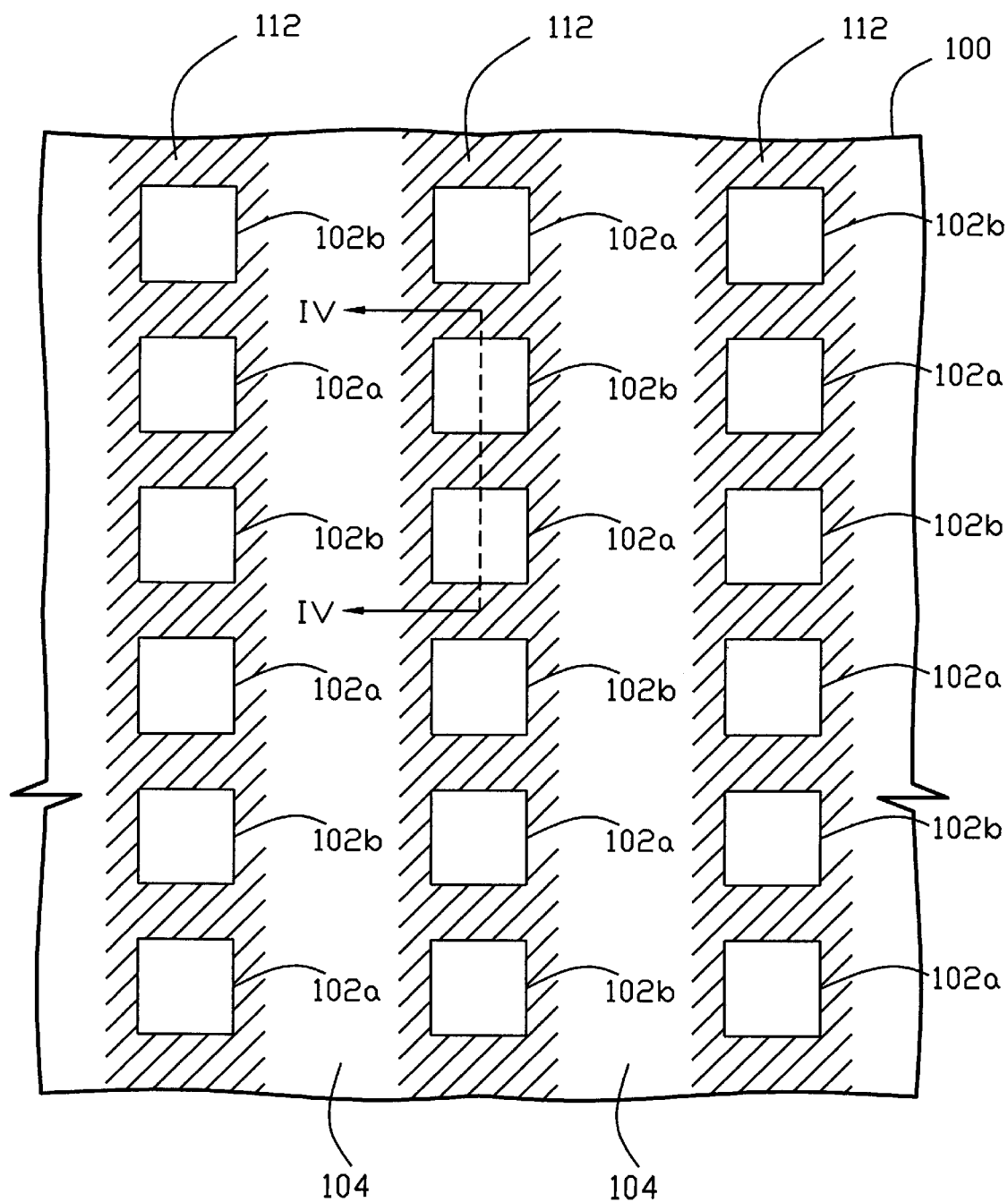
FIG. 1 is a diagrammatic bottom plan view illustrating a hole-pattern mask structure according to the present invention.

FIG. 1 is a diagrammatic bottom view illustrating a hole-pattern mask according to the present invention. Referring to FIG. 1, first hole features 102a and second hole features 102b are alternatively located on a substrate (not shown). The first hole features 102a have a transmission of about 100% (substantially transparent) and have a phase shift of about 0 degrees. The second hole features 102b have a transmission of about 100% (substantially transparent) and have a phase shift of about 180 degrees. A background 112, which adjacently surrounds each of the first and the second hole features 102a, 102b on the substrate, has a phase shift of about 90 degrees and has a transmission between 0 and 100% (lightly transparent such as 6% transmission is preferable). Besides the background 112, the mask 100 further comprises blocks 104 located between the first and the second hole features 102a, 102b. The blocks 104 between the hole features 102a, 102b have a transmission of about 0% and have a phase shift of about 0 degrees.

Figure 2A:
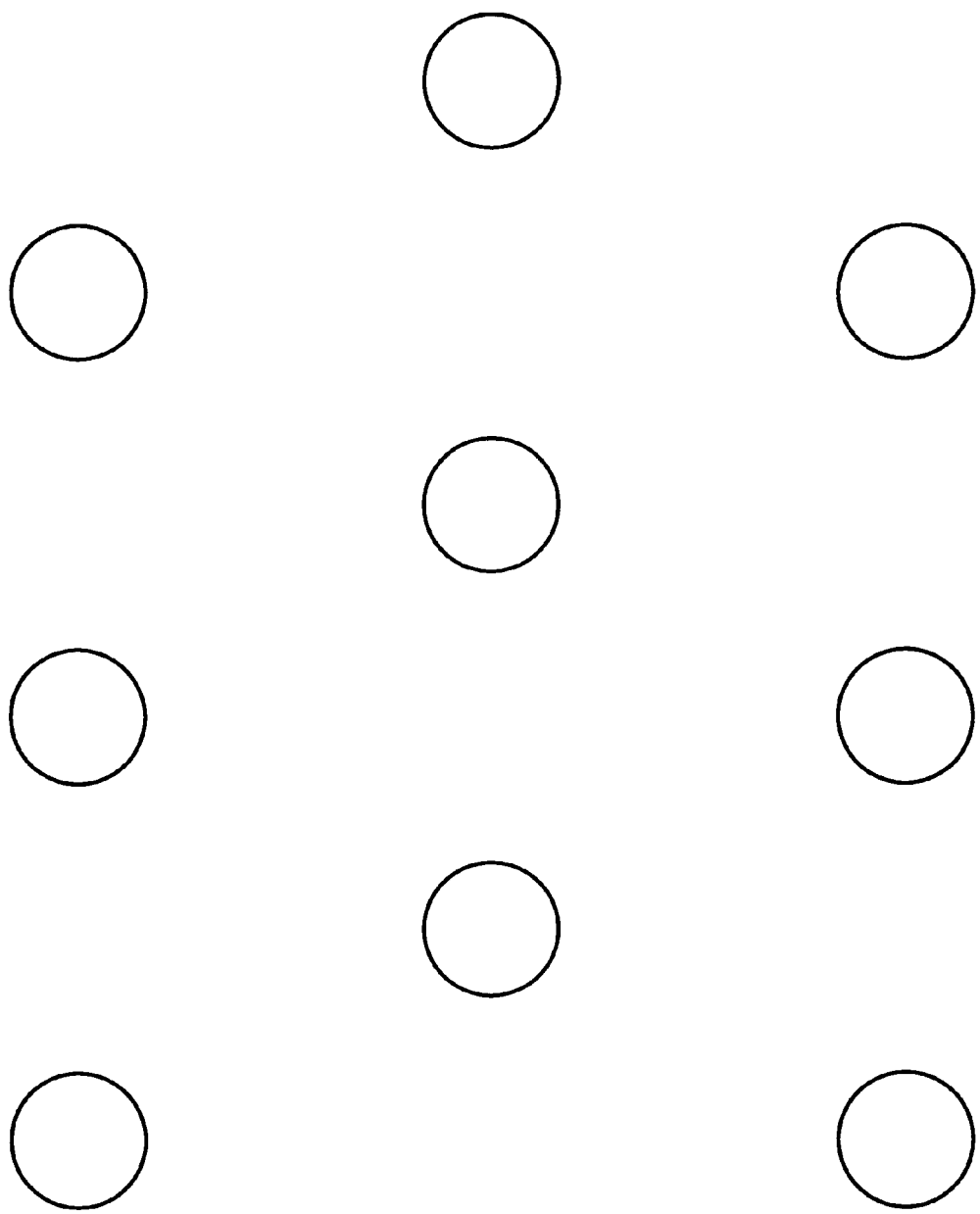
FIG. 2A depicts a first aerial image for the exposure light through the hole features of a mask, at −0.3 μm defocus, when the mask shown in FIG. 1 is used.

If a wafer is exposed with an exposure light through the mask 100 at about −0.3 μm defocus, the patterns of the first hole features 102a, but not of the second hole features 102b, will be printed onto the wafer, as shown in the first aerial image of FIG. 2A. If a wafer is exposed with an exposure light through the mask 100 at about +0.3 μm defocus, the patterns of the second hole features 102b, but not of the first hole features 102a, will be printed onto the wafer, as shown in the second aerial image of FIG. 2A. The difference between the first aerial image and the second aerial image is resulted from that the background 112 is specially designed to have 90 degrees phase differences from that of the first hole features 102a, and from that of the second hole features 102b, respectively.

Figure 3:
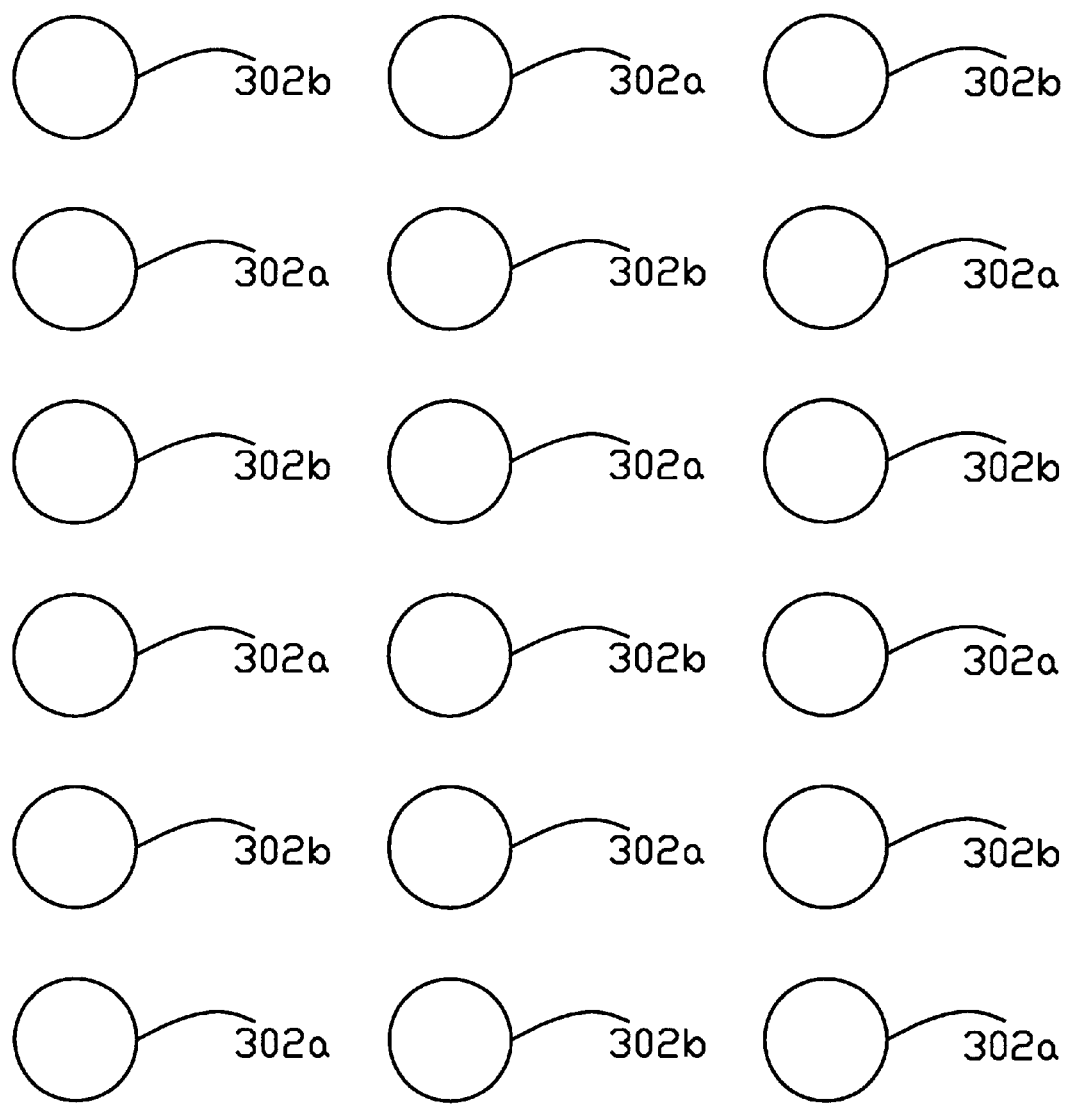
FIG. 3 depicts a final aerial image after a bi-focus (0.3 & −0.3 μm) exposure is performed using the mask shown in FIG. 1.

Due to the phase differences between the hole features 102a, 102b and the background 112, two images, also the final image as shown in FIG. 3, will be obtained after the two exposure steps at different defocus conditions (−0.3 & +0.3 μm) are performed through the same mask 100. Such bi-focus exposure technology achieves narrow width patterning by one-mask approach which will not suffer low throughput and poor alignment accuracy.

Figure 2B:
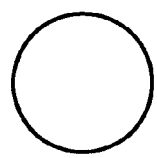
FIG. 2B depicts a second aerial image for the exposure light through the hole features of a mask, at 0.3 μm defocus, when the mask shown in FIG. 1 is used.
Figure 2B:
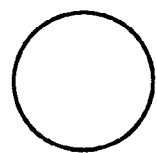
Figure 2B:
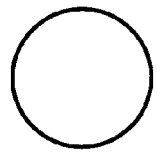
Figure 2B:
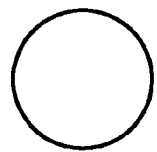
Figure 2B:
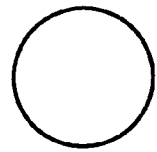
Figure 2B:
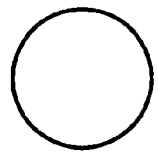
Figure 2B:
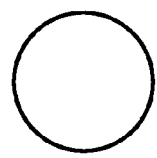
Figure 2B:
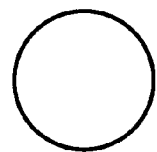
Figure 2B:
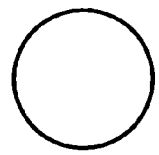

Still referring to FIG. 3, because the intensity plots 302a, 302b of the final image are essentially close to each other, the exposure resolution is a concern. Since the hole-to-hole distance in each step (as shown in FIG. 2A and FIG. 2B) of the double exposure is substantially greater than that of a prior art two-mask approach, applying the present invention to print out the final image benefits resolution increase.

Figure 4:
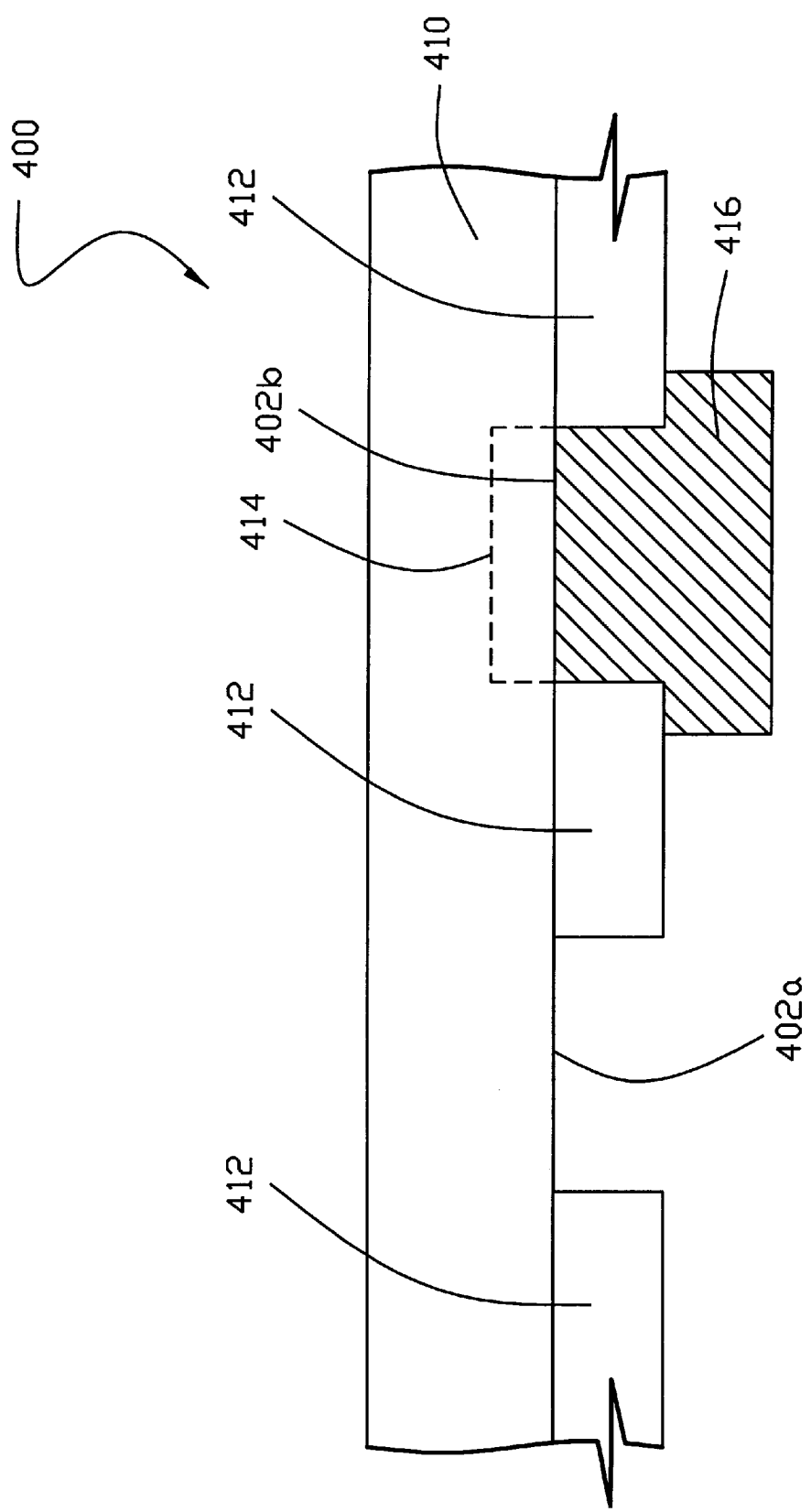
FIG. 4 is a cross section taken along section line IV—IV of FIG. 1.

FIG. 4 is a cross section taken along section line IV—IV of FIG. 1. Referring now to FIG. 4, a part of the mask 400 schematically representing the mask 100 (FIG. 1) is shown. The mask 400 comprises a transparent substrate 410 having a phase shift of 0 degrees. The transparent substrate 410 is formed of a material, such as quartz. In a bottom view of FIG. 4, a patterned material layer 412 (i.e., a part of the background 112) having a phase shift of about 90 degrees, and having a transmission of about 6% (not limited), is formed on the substrate 410. The patterned material layer 412, which is made from, for example, MoSiOxNy, MoSi, or other half tone phase shifting materials, has two holes exposing two regions 402a, 402b of the substrate 410, respectively. One of the regions 402b is etched to be thinner 414, thereby generating an optical-path difference between the etched region 402b and the non-etched region 402a such that a phase difference of about 180 degrees between the regions 402a, 402b is created. The phase difference can be alternatively created by over-filling one of the holes with another material layer 416 having a phase-shift of about 180 degrees. The material layer over-filling the hole is patterned to substantially cover only the region 402b exposed by the hole.

Figure 5:
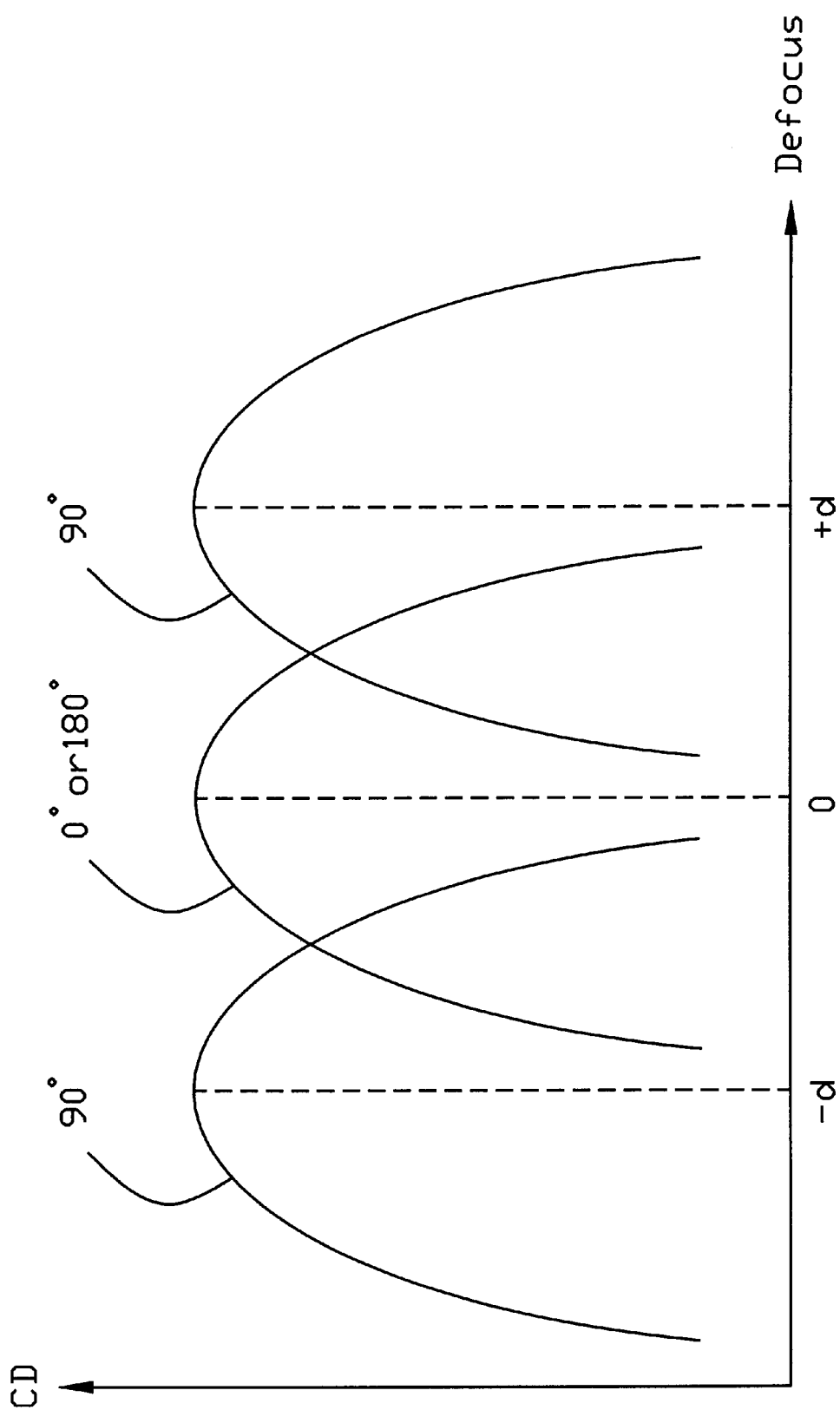
FIG. 5 graphically depicts simulated CD(critical dimension)defocus curves for two types of masks.

Referring to FIG. 5, simulated CD-defocus curves for two types of masks are graphically depicted. The mask (90°) of the invention can print a first image (FIG. 2A) having a first best focus position shift –d relative to the best focus position of the image created by another type of mask (0° or 180°). The another type of mask is substantially the same as the mask of the invention, but the difference is that the background of the type of mask has a phase shift of about 0 or 180 degrees, rather than 90 degrees. Besides the first image, the mask of the invention can print a second image (FIG. 2B) having a second best focus position shift +d relative to the best focus position of the image created by this type of mask. In other words, the best focus of the mask 100 (FIG. 1) is split into two due to the specially designed background 112 (FIG. 1) having a phase shift of about 90 degrees. Therefore, we can separately expose the wafer at –d and +d defocuses to print the desired patterns on the wafer. According to the previously described embodiment(s), the –d and +d are preferably equal to, but not limited to about –0.3□m and about +0.3□m, respectively.

The previously described embodiment(s) of the present invention have at least the following advantages:

1. By exposing through only one mask, we can perform a double exposure on a wafer without mask exchanging, thereby increasing the throughput.

2. Because the double exposure of this invention is performed using only one mask, no mask errors exist in this double exposure.

3. This invention divides the desired hole patterns into two portions of which each has a hole-to-hole distance substantially greater than that of a prior art two-mask approach. By this way, the pitch (a hole and the adjacent space to the next hole) of the invention has a width substantially broader than that of a prior art mask. In other words, this invention increases the width of the pitch without affecting the final image intensity plots, thereby improving the exposure resolution.

Although specific embodiments have been illustrated and described, it will be obvious to those skilled in the art that various modifications may be made without departing from the spirit which is intended to be limited solely by the appended claims.

What is claimed is:

1. A bi-focus exposure process for exposing a wafer, comprising:
   providing a mask on the wafer, wherein the mask comprises:
      a transparent substrate having a phase shift of about 0 degrees;
      a plurality of first hole features having a transmission of about 100% and having a phase shift of about 0 degrees on the substrate;
      a plurality of second hole features having a transmission of about 100% and having a phase shift of about 180 degrees on the substrate, wherein the second hole features and the first hole features are alternatively located on the substrate; and
      a patterned material layer, having a transmission between 0 and 100% and having a phase shift of about 90 degrees, substantially and adjacently surrounds each of the first and the second hole features on the substrate;
   exposing the wafer through the mask at a first defocus to print the patterns of the first hole features on the wafer; and
   exposing the wafer through the mask at a second defocus to print the patterns of the second hole features on the wafer.

2. The bi-focus exposure process of claim 1, wherein the first defocus is about –0.3 $\mu$m defocus.

3. The bi-focus exposure process of claim 1, wherein the second defocus is about +0.3 $\mu$m defocus.

4. The bi-focus exposure process of claim 1, wherein the patterned material layer has a transmission of about 6%.

5. The bi-focus exposure process of claim 1, wherein the second hole features are formed by etching a portion of the substrate to thinner the portion of the substrate.

6. The bi-focus exposure process of claim 1, wherein the second hole features are materials deposited on the substrate having a transmission of about 100% and having a phase shift of about 180 degrees.

7. The bi-focus exposure process of claim 6, wherein the deposited materials comprise MoSiOxNy.

8. The bi-focus exposure process of claim 6, wherein the deposited materials comprise MoSi.

9. A process of exposing a wafer through a mask, wherein the mask comprises a plurality of first transparent hole features having a phase shift of about 0 degrees and a plurality of second transparent hole features having a phase shift of about 180 degrees, the first and the second hole features are alternatively located on a transparent substrate, and each of the first and the second hole features is substantially and adjacently surrounded by a lightly transparent material having a phase shift of about 90 degrees on the transparent substrate, which process comprises:
   exposing the wafer through the mask at a first defocus to print the patterns of the first hole features on the wafer, wherein the first defocus is smaller than 0 $\mu$m defocus; and
   exposing the wafer through the mask at a second defocus to print the patterns of the second hole features on the wafer, wherein the second defocus is greater than 0 $\mu$m defocus.

10. The process of claim 9, wherein the first defocus is about −0.3 μm defocus.

11. The process of claim 9, wherein the second defocus is about +0.3 μm defocus.

12. The process of claim 9, wherein the lightly transparent material has a transmission of about 6%.

* * * * *